(12) United States Patent
Hèbert et al.

(10) Patent No.: US 6,365,447 B1
(45) Date of Patent: *Apr. 2, 2002

(54) HIGH-VOLTAGE COMPLEMENTARY BIPOLAR AND BICMOS TECHNOLOGY USING DOUBLE EXPITAXIAL GROWTH

(75) Inventors: Francois Hèbert, San Mateo; Datong Chen, Fremont; Reda Razouk, Sunnyvale, all of CA (US)

(73) Assignee: National Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/005,786

(22) Filed: Jan. 12, 1998

(51) Int. Cl.[7] ............................................. H01L 21/8238
(52) U.S. Cl. ..................... 438/203; 438/234; 438/322; 438/358
(58) Field of Search ................ 438/309, 311, 438/365, 322, 356, 411, 416, 202, 203, 234, 404, 323, 357, 358; 257/511, 565, 574

(56) References Cited

U.S. PATENT DOCUMENTS

| 4,038,680 A | * | 7/1977 | Yagi et al. | ................ 438/322 |
| 4,089,021 A | | 5/1978 | Sato et al. | |
| 4,780,430 A | | 10/1988 | Musumeci et al. | |
| 5,023,194 A | * | 6/1991 | Gianella | .................... 438/322 |
| 5,065,213 A | | 11/1991 | Frisina et al. | |
| 5,118,635 A | | 6/1992 | Frisina et al. | |
| 5,344,785 A | * | 9/1994 | Jerome et al. | ............... 438/311 |
| 5,716,887 A | * | 2/1998 | Kim | ............................ 438/309 |

OTHER PUBLICATIONS

Imaizumi et al., Novel IC Structure for 150V High–Voltage Consumer IC, pp. 367–375, Aug. 1980.
Carlson et al., Novel Scaling Technique for High Voltage Analog ICs, pp. 85–89, Mar. 1991.
Bashir et al., A 85 Volt High Performance Silicon Complementary Bipolar Technology for High Voltage Analog Applications, pp. 217–220, 1993.

* cited by examiner

Primary Examiner—Tuan H. Nguyen
(74) Attorney, Agent, or Firm—Stallman & Pollock LLP

(57) ABSTRACT

A method of making high voltage complementary bipolar and BiCMOS devices on a common substrate. The bipolar devices are vertical NPN and PNP transistors having the same structure. The fabrication process utilizes trench isolation and thus is scalable. The process uses two epitaxial silicon layers to form the high voltage NPN collector, with the PNP collector formed from a p-well diffused into the two epitaxial layers. The collector contact resistance is minimized by the use of sinker up/down structures formed at the interface of the two epitaxial layers. The process minimizes the thermal budget and therefore the up diffusion of the NPN and PNP buried layers. This maximizes the breakdown voltage at the collector-emitter junction for a given epitaxial thickness. The epitaxial layers may be doped as required depending upon the specifications for the high voltage NPN device. The process is compatible with the fabrication of low voltage devices, which can be formed by placing the sinker regions under the emitter region. The thicknesses of the two epitaxial layers may be adjusted as required depending upon the specifications for the low voltage devices.

1 Claim, 6 Drawing Sheets

HIGH-VOLTAGE COMPLEMENTARY BIPOLAR AND BICMOS TECHNOLOGY USING DOUBLE EXPITAXIAL GROWTH

TECHNICAL FIELD

The present invention is directed to processes for fabricating complementary bipolar and BiCMOS transistors for use in high-voltage applications, and more specifically, to a method for making such devices using a double epitaxial growth step to form the collectors for the two devices. This has the benefit of minimizing the thermal budget used in the fabrication process and reducing the up-diffusion of dopants from the buried layers.

BACKGROUND OF THE INVENTION

The fabrication of complementary bipolar (CB) transistors on a common substrate is of great interest in the production of high-precision, high-frequency and high-voltage analog circuits. A high-performance PNP transistor in conjunction with a NPN transistor in the signal path permits the design of push-pull circuits for analog applications. High-performance PNP devices can also enhance circuit performance by acting as active loads and as drivers in the outputs stages, thereby reducing the current supply.

It has been a continuing technological challenge to integrate vertical PNP devices into a high performance NPN process without significantly degrading the performance of the NPN devices. This is essential for high performance, low noise and high frequency applications such as operational amplifiers, voltage regulators, phase-locked loop circuits, and D/A converters. Other high-voltage and high-frequency applications which could benefit from such a technology include CRT drivers, instrumentation amplifiers, interface circuits and telecommunication circuits.

The article entitled "A 85 Volt High Performance Silicon Complementary Bipolar Technology for High Voltage Analog Applications", *Proceedings of the 24th European Solid State Device Research Conference,* 1994, p. 217, discusses a high performance complementary bipolar technology for use in fabricating high-frequency and high-voltage analog circuits. The technology described uses an N-type epitaxial silicon layer to form the collector for the NPN device. A sinker-up region for minimizing collector resistance of the NPN device is implanted prior to growth of the epitaxial layer. Sinker-down regions are used for both the NPN and PNP devices. The breakdown voltage of the devices is less than 100 volts, which is insufficient for some high voltage applications. In addition, the process cannot be scaled because junction isolation is used. Another disadvantage is that the breakdown voltage of the NPN transistor cannot be optimized independently of the PNP transistor, leading to a compromising of the performance of the NPN transistor.

The article entitled "Novel Scaling Technique for High Voltage Analog ICs", *Solid State Technology,* March, 1991, page 85, describes how a 15 to 40 percent scaling of high voltage analog devices was obtained by replacing a single epitaxial layer with three, graded layers having different thicknesses and resistivities. This reduced the thermal cycles required for junction isolation and the lateral out-diffusion of dopants which increase the width of the isolation region. However, a disadvantage of this process is that it cannot be used to produce truly complementary bipolar devices because the NPN collector doping differs from the PNP collector doping. The article entitled "Novel IC Structure for 150V High-Voltage Consumer IC", *IEEE Transactions on Consumer Electronics,* vol. CE-26, August, 1980, p. 367, describes how a single epitaxial layer having a varying thickness is used to form both high-voltage and small signal devices on the same substrate. The isolation region between the two devices is diffused in the thin region of the epitaxial layer and the high voltage device is formed in a well in the thick region of the epitaxial layer. The process requires that complex processing steps be used to planarize the substrate and to adjust the thicknesses of the epitaxial layer in the two regions.

U.S. Pat. No. 4,089,021, issued May 9, 1978, discloses a method of fabricating a high-voltage semiconductor device in which the lateral extent of the isolation regions can be reduced to provide increased integration density of the devices. This is accomplished by forming one or more recessed regions in a substrate and then growing an epitaxial layer over the substrate. As with the IEEE article discussed above, by planarizing the epitaxial layer, isolation regions may be formed in a thinner region of the layer while the high voltage device may be formed in the thicker regions.

U.S. Pat. No. 5,065,213, issued Nov. 12, 1991, and U.S. Pat. No. 5,118,635, issued Jun. 2, 1992, both naming Frisina et al. as inventors, disclose a process for manufacturing a high voltage bipolar power transistor and low voltage MOS power transistor on a common substrate. The process uses two epitaxial layers with a vertical NPN transistor formed in the first layer and a CMOS transistor formed on top of the NPN device's emitter in the second layer. The epitaxial layers have different characteristics since they are used to form different types of devices. However, the fabrication process described in the '231 and '635 patents does not use sinker regions to reduce the collector contact resistance and is not compatible with complementary bipolar process flows.

U.S. Pat. No. 4,780,430, issued Oct. 25, 1988, naming Musumeci et al. as inventors, discloses a process for fabricating a high voltage monolithic semiconductor device that contains a power transistor and an integrated control circuit. In the process, three epitaxial layers are grown with two of the layers having different thicknesses and the same N-doping concentration, and the third layer being doped N type. A N+ type substrate is used and the devices are not isolated. The process described in the '430 patent does not use sinker regions to reduce the collector contact resistance and is not compatible with the fabrication of complementary bipolar devices.

What is desired is a method of fabricating high voltage vertical NPN and PNP devices on a common substrate, where the devices are truly complementary (have the same structure) and can have their parameters optimized independently of each other. It is further desired that the collector contact resistance of the devices be minimized by the use of deep sinker and buried layer structures to improve the performance of the devices. It is also desired that the fabrication method be compatible with trench isolation techniques to permit scaling of the process. This requires that the trench depth be minimized. Finally, it is desired that the high voltage device process be compatible with the formation of lower voltage vertical NPN and PNP devices, and that the lower voltage devices be formed without the use of additional masking steps and be capable of being optimized independently of the high voltage devices.

SUMMARY OF THE INVENTION

The present invention is directed to a method of making high voltage complementary bipolar and BiCMOS devices on a common substrate. The bipolar devices are vertical NPN and PNP transistors having the same structure. The fabrication process utilizes trench isolation and thus is scalable. The process uses two epitaxial silicon layers to form the high voltage NPN collector, with the PNP collector formed from a p-well diffused into the two epitaxial layers. The collector contact resistance is minimized by the use of sinker up/down structures formed at the interface of the two epitaxial layers. The process minimizes the thermal budget and therefore the up diffusion of the NPN and PNP buried layers. This maximizes the breakdown voltage at the collector-emitter junction for a given epitaxial thickness. The epitaxial layers may be doped as required depending upon the specifications for the high voltage NPN device. The process is compatible with the fabrication of low voltage devices, which can be formed by placing the sinker regions under the emitter region. The thicknesses of the two epitaxial layers may be adjusted as required depending upon the specifications for the low voltage devices.

The high voltage complementary bipolar and BiCMOS process is based on a silicon-on-insulator structure which forms the substrate for fabrication of the devices. Buried layers for the NPN and PNP devices are formed by well known masking, implanting and anneal steps. A first epitaxial layer is then grown over the surface of the substrate. A thin screen oxide layer is then grown over the epitaxial layer. N+ and P+ type sinker up and/or sinker down regions are then formed in the first epitaxial layer. The sinker regions are used both as part of a low resistance contact for the high voltage device collectors and as a buried layer for the low voltage devices being fabricated on the same substrate. The structure is annealed and cleaned and then a second epitaxial layer is grown over the surface of the substrate.

Again, a thin screen oxide layer is grown and N+ and P+ type sinker up and/or sinker down regions are formed in the second layer. A pad or screen oxide layer is then grown over the top surface of the substrate. Optional N+ and P+ type sinker down structures may then be formed. A p-well structure is then formed in the PNP device regions. Nitride layer deposition and field oxide layer formation is then performed. Trench isolation structures are then formed in the substrate between each of the active device regions. Diffusion of the sinker and p-well regions is then performed. Finally, the processing steps needed to complete formation of the CMOS, vertical high voltage NPN and PNP, and vertical low voltage NPN and PNP devices are performed on the active device regions.

Further objects and advantages of the present invention will become apparent from the following detailed description and accompanying drawings.

DETAILED DESCRIPTION OF THE INVENTION

Figure 1A:
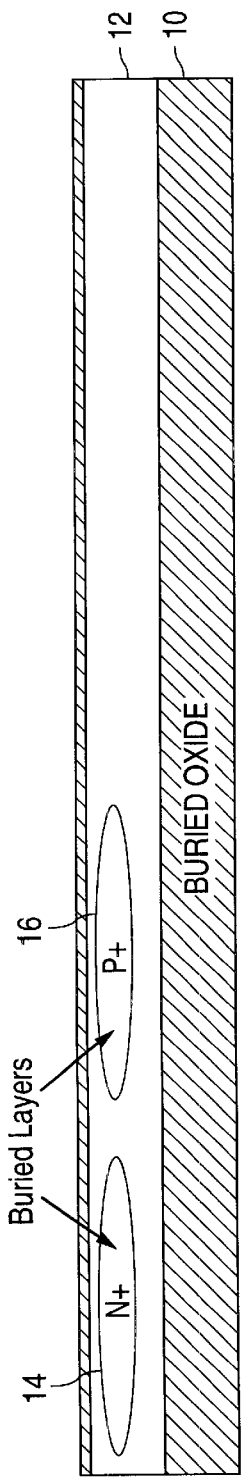
FIGS. 1(a) through 1(e) are cross-sectional views showing the process flow for forming high voltage complementary bipolar and BiCMOS transistors according to the double epitaxial growth process of the present invention.

FIGS. 1(a) through 1(e) are cross-sectional views showing the process flow for forming high voltage complementary bipolar and BiCMOS transistors according to the double epitaxial growth process of the present invention. As shown in FIG. 1(a), a silicon-on-insulator (SOI) structure provides the substrate in which the devices are formed. In conjunction with trench isolation techniques, this provides complete isolation for the fabricated devices. The SOI structure is composed of a silicon substrate (not shown), a buried oxide layer 10 arranged on top of the substrate, and a silicon or polysilicon layer 12 arranged over buried oxide layer 10.

Buried layers for the high voltage NPN and PNP devices are then formed in the substrate. N+ type buried layer 14 for the NPN device is formed by masking and implanting steps well known in the semiconductor industry. Typically, Antimony or Arsenic is implanted in layer 12 to form the N+ buried layer. An anneal step is then performed to drive in the dopant. P+ type buried layer 16 for the PNP device is then formed by the masking and implanting steps. Typically, Boron is implanted in layer 12 to form the P+ buried layer. An anneal step is then performed to drive in the dopant. The resulting structure is shown in FIG. 1(a).

Figure 1B:
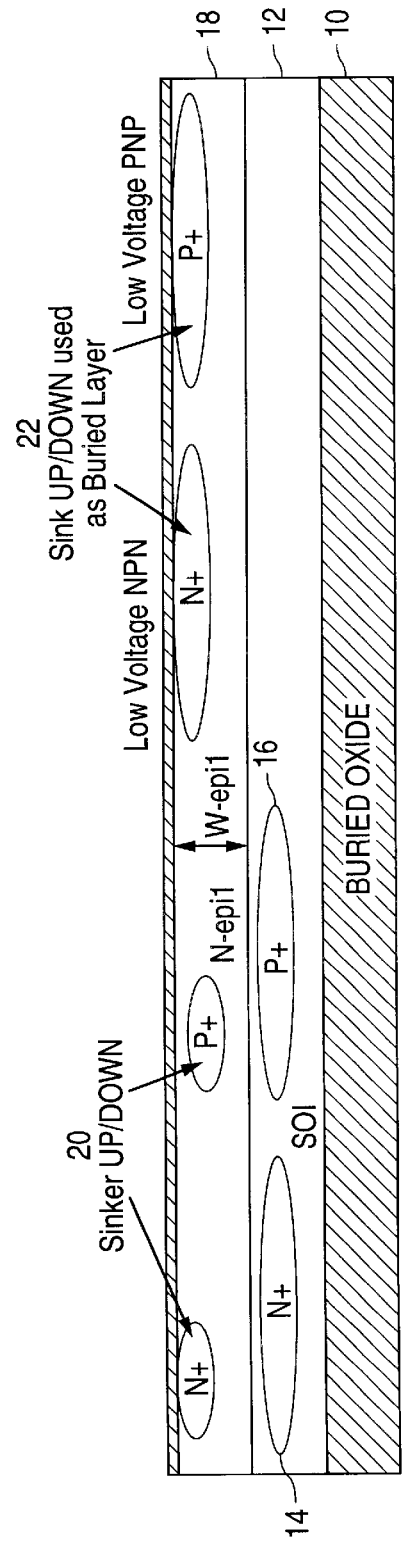

The surface of the substrate is then cleaned. A first epitaxial silicon layer (element 18 of FIG. 1(b)) is then grown over the surface of the substrate. A thin screen oxide layer (not shown) is then grown over epitaxial layer 18. The screen oxide layer is appropriately masked to define the locations for the sinker up and/or sinker down structures 20 which will be formed by implanting dopants into epitaxial layer 18. An N+ type dopant is implanted into the sinker region defined for the high voltage NPN device and a P+ type dopant is implanted into the sinker region defined for the high voltage PNP device. Note that similar sinker structures may also be formed in epitaxial layer 18 in the substrate regions where the low voltage bipolar devices will be formed. These sinker structures 22 will serve as buried layers for the low voltage NPN and PNP devices. An anneal step is then used to drive in the implanted dopants. The resulting structure is shown in FIG. 1(b).

Figure 1C:
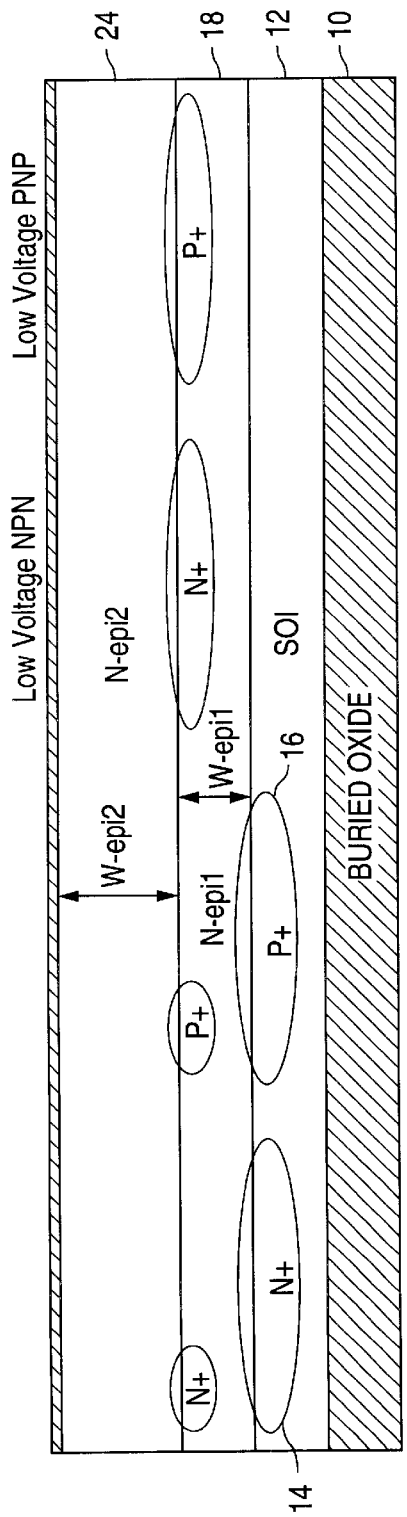

The surface of the substrate is then cleaned. A second epitaxial silicon layer (element 24 of FIG. 1(c)) is then grown over the surface of the substrate. A thin screen oxide layer (not shown) is then grown over epitaxial layer 24. The screen oxide layer is appropriately masked to define the locations for the sinker up and/or sinker down structures which will be formed by implanting dopants into epitaxial layer 24. An N+ type dopant (typically Phosphorus) is implanted into the sinker regions defined for the high and low voltage NPN devices and a P+ type dopant (typically Boron or Aluminum) is implanted into the sinker regions defined for the high and low voltage PNP devices. An anneal step is then used to drive in the implanted dopants. A thermal oxidation step is then used to grow a thin (200 to 1100 Å thick) layer of pad or screen oxide over the top surface of the substrate. The resulting structure is shown in FIG. 1(c). It is noted the sinker structures formed in the first and second epitaxial layers merge during the anneal step to form sinker regions which extend across the boundary between the two epitaxial layers. This provides a conductive path across the boundary between the two epitaxial layers.

Figure 1D:
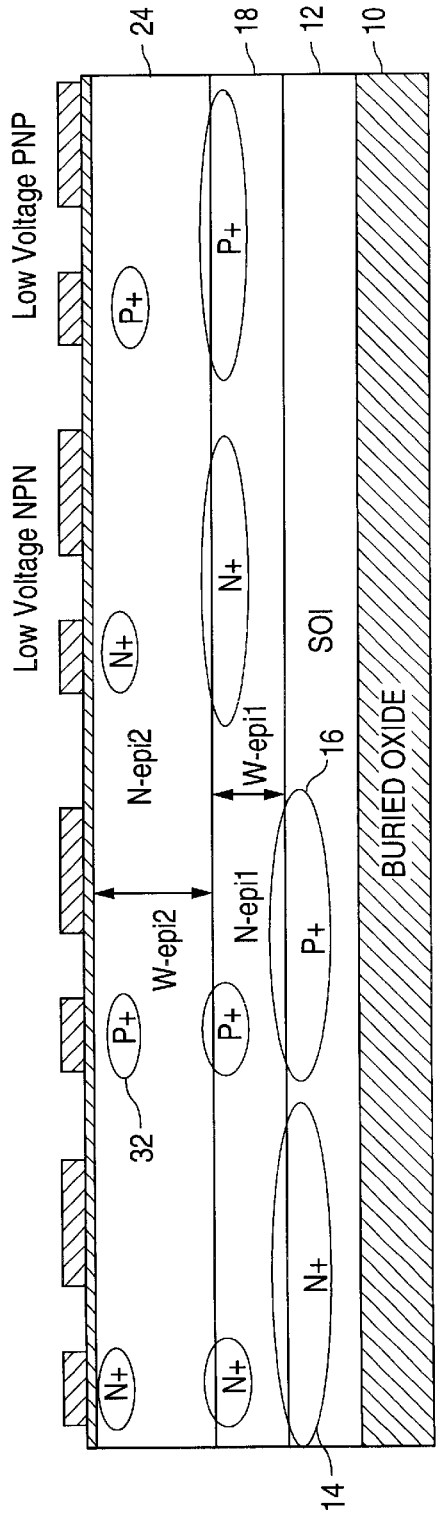

If desired for the intended application, N+ and P+ sinker down structures may then be formed at the top of second epitaxial layer 24 using the standard masking and implant steps. Optional N+ type sinker down 30 may be formed by implanting Phosphorus, while optional P+ type sinker down region 32 may be formed by implanting Boron. As shown in FIG. 1(d), the sinker down structures may be formed in both the high voltage and low voltage device regions of the substrate.

A mask is then used to define the region in which the p-wells of the high and low voltage PNP devices will be formed by diffusion of an implanted dopant into the two epitaxial layers. Boron and/or Aluminum is then implanted into the defined p-well regions 36. This technique forms the p-wells by diffusion of the dopants from the top surface of the structure downward into the two epitaxial layers. It is noted that the p-wells may also be formed by up/down diffusion of a previously implanted dopant from the interface region of the two epitaxial layers. If desired, multiple implants into the top surface of the structure having varying energies may also be used to form the p-well regions.

A nitride layer 38 is then deposited over the surface of the substrate. Nitride layer 38 is typically 500 to 2000 Å thick. Layer 38 is then masked to define the isolation trench locations (and protect the active device regions) and etched to remove the nitride from the spaces in which the trenches will be formed. A field oxide layer is then formed over the surface of the substrate.

Figure 1E:
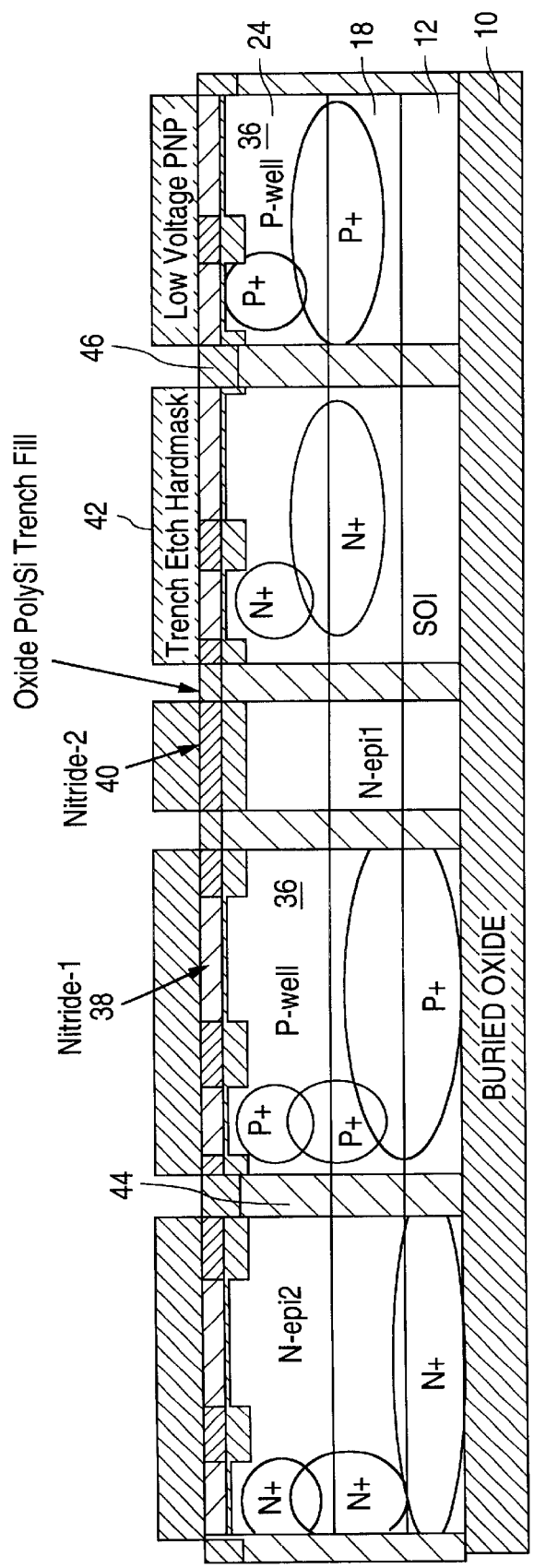

Trench isolation structures are then formed to provide side wall isolation for the active device regions. A typical process flow for forming the trench structures includes the following steps:

(1) deposition of a nitride layer (element 40 of FIG. 1(e));
(2) deposition of an oxide layer;
(3) definition of the trench locations using a trench etch mask (element 42) and etching of the oxide nitride layers;
(4) stripping of the resist (mask) layer and etching of the trenches into the epitaxial layers and silicon layer down to the buried oxide layer;
(5) oxidation of the trench sidewalls;
(6) deposition of polysilicon (element 44) into the etched trenches;
(7) etchback of the deposited polysilicon to form a planar top surface; and
(8) oxidation of the exposed polysilicon at the top of the trenches. This provides an oxide "cap" 46 on top of the polysilicon filled trench.

The sinker and p-well structures are then formed through diffusion of the previously implanted dopants by using an appropriate anneal step. This causes the sinker regions and buried layers to become electrically connected. The resulting structure is shown in FIG. 1(e).

Figure 2:
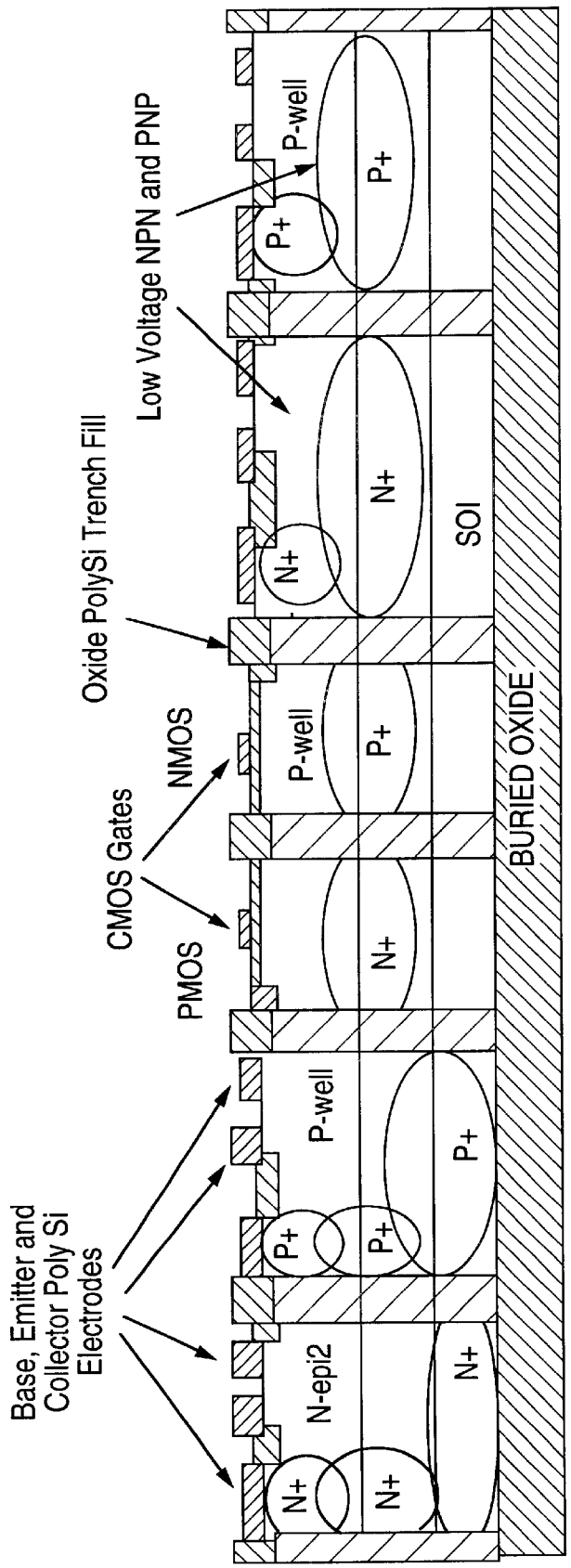
FIG. 2 is a cross-sectional view showing the high voltage complementary bipolar and BiCMOS devices formed according to the method of the present invention.

The desired transistors are then formed in the previously defined active device regions. CMOS, vertical high voltage NPN and PNP devices, and vertical low voltage NPN and PNP devices, are formed in the structure shown in FIG. 1(e) using the standard process steps suited for CMOS and/or complementary bipolar fabrication. The structure may also be used as part of a complementary BiCMOS process flow in which an NMOS transistor is formed in a p-well, a PMOS transistor is formed in the epitaxial layers, and high and low voltage NPN and PNP devices are formed in the defined active device regions. The base, emitter, and collector electrodes are formed from a patterned layer of polysilicon, as are the gates for NMOS and PMOS devices. A possible resulting structure is shown in FIG. 2.

As has been described, the present invention utilizes two epitaxial layers to provide the desired characteristics of the high and low voltage devices. The resistivity (doping profile) of the epitaxial layers is selected based upon the high voltage transistor breakdown voltage requirements (BVceo and BVcbo). The total thickness of the two epitaxial layers is also selected based on the high voltage transistor breakdown voltage requirements. The inventors have determined that the thickness of the respective layers can be selected based upon the following guidelines:

(1) when the low voltage transistor BVceo is low, the thickness of the first epitaxial layer is made equal to or greater than the thickness of the second epitaxial layer; and
(2) when the low voltage transistor BVceo is high, the thickness of the first epitaxial layer is made less than the thickness of the second epitaxial layer.

Figure 3:
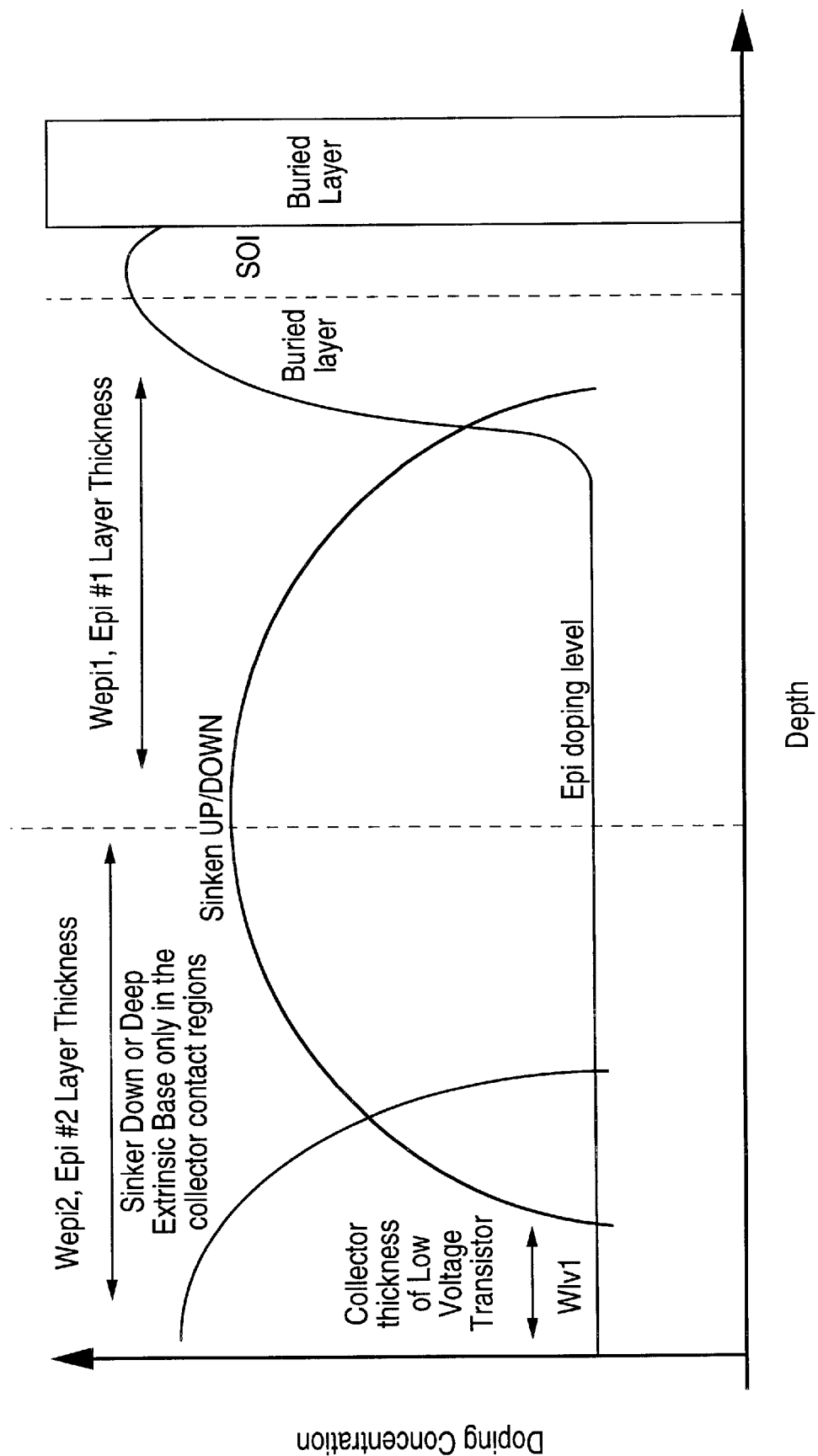
FIG. 3 is a graph showing dopant concentration as a function of depth from the top surface of the substrate down into the epitaxial layers for the case of equal epitaxial layer thicknesses.
Figure 4:
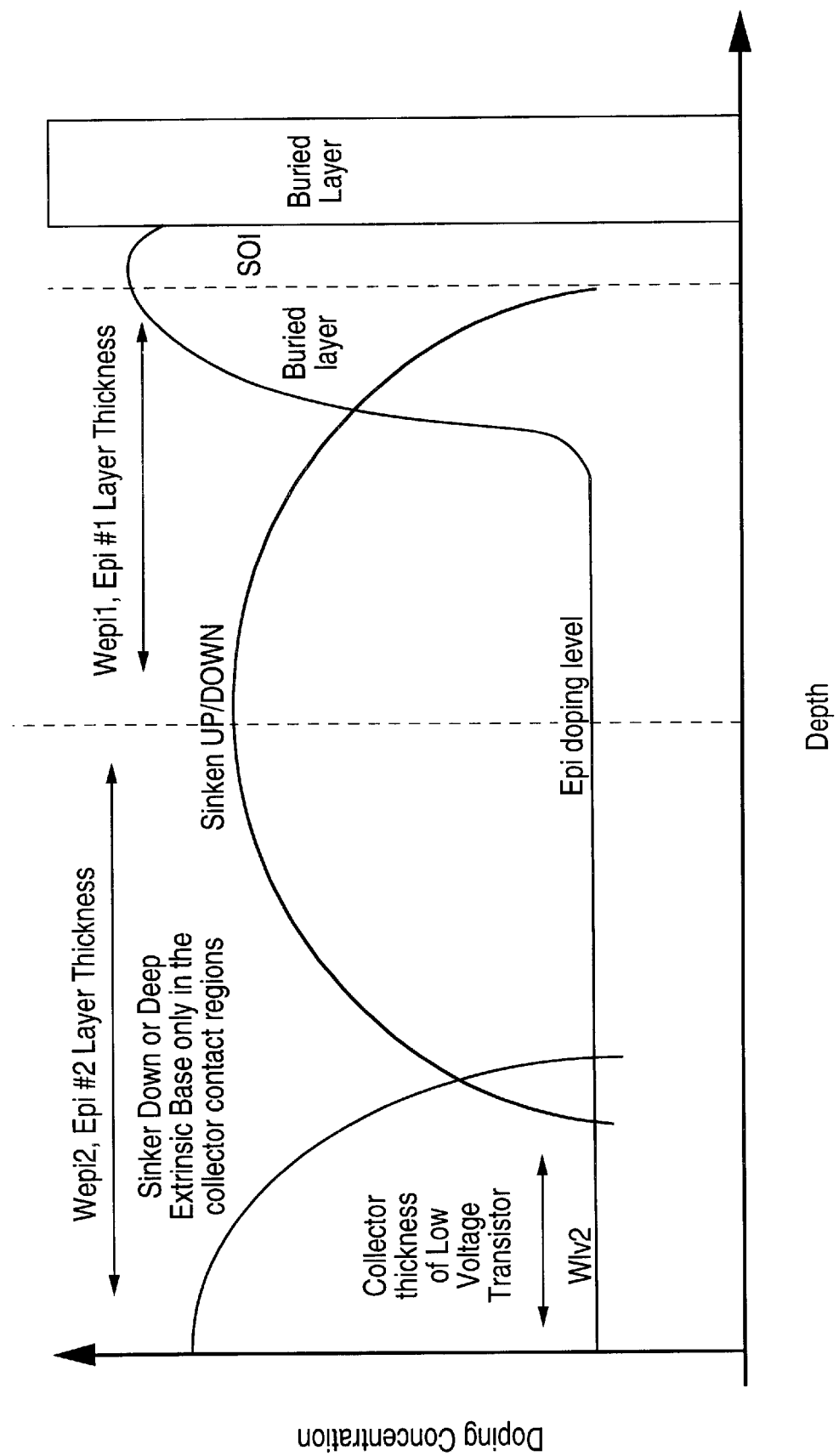
FIG. 4 is a graph showing dopant concentration as a function of depth from the top surface of the substrate down into the epitaxial layers for the case of unequal epitaxial layer thicknesses.

FIG. 3 is a graph showing dopant concentration as a function of depth from the top surface of the substrate down into the epitaxial layers for the case of equal epitaxial layer thicknesses. FIG. 4 is a graph showing dopant concentration as a function of depth from the top surface of the substrate down into the epitaxial layers for the case of unequal epitaxial layer thicknesses. As shown in the graphs, the collector thickness of the low voltage device is determined by the sinker up diffusion from the interface between the two epitaxial layers. Thus, by varying the relative thickness of the two epitaxial layers, the characteristics of the low voltage device may be altered.

The use of two epitaxial layers in the method of the present invention provides several significant advantages when fabricating complementary bipolar and BiCMOS devices. Because the sinker regions are formed by diffusion of dopants at the interface of the two epitaxial layers, the dopants have a shorter distance which they must diffuse over compared to the situation in which they are implanted into the top surface of a single, thicker epitaxial layer. This means that a shorter anneal time is required to form the sinker regions, reducing the thermal budget for the process. The reduced thermal budget means that the up diffusion of dopants in the NPN and PNP buried layers (elements 14 and 16 of FIG. 1(b)) is reduced, producing a greater breakdown voltage value (BVceo) for a given epitaxial layer thickness.

The inventors have performed simulations which verify that the double epitaxial layer method of the present invention reduces the anneal time required to link the sinker down and sinker up regions by diffusion of the implanted dopants. This means that a reduced thermal budget is used to link the surface of the structure and the buried layers, resulting in less up diffusion of the dopants from the buried layer. This provides greater control over the doping profile and characteristics of the devices.

In a set of simulations, a complementary BiCMOS process designed to produce high voltage devices having a breakdown voltage greater than 150 volts was investigated. For these simulations, the following process specifications were assumed:

a substrate composed of a 2.5 micron thick silicon layer arranged over a 1 micron thick buried oxide layer;
Antimony and Boron as the buried layer dopants;
N-type epitaxial layer having a doping level of $7 \times 10^{14}$ ions/cm$^3$; and
a total epitaxial collector thickness of 16 microns.

Using the above parameters, two test cases were investigated and compared to the standard single epitaxial layer process. In the first test case, the thickness of the two epitaxial layers was equal. The low voltage transistor collector thickness which resulted was between 2.0 and 2.5 microns. In the second test case, the first epitaxial layer had a thickness equal to 40% of the total epitaxial layer thickness, while the second layer had a thickness equal to 60% of the total epitaxial layer thickness. The low voltage transistor collector thickness which resulted was approximately 5 microns. Using these parameters the simulations showed a significant reduction in the sinker drive time using the double epitaxial layer structure of the present invention.

For example, with a single epitaxial layer, a sinker drive time of 1500 minutes at a temperature of 1150° C. was required to link the top surface to the high voltage NPN buried layer (i.e., to link the sinker down and sinker up diffusions) at a doping level greater than $10^{16}$ ions/cm$^3$. The long sinker diffusion time results in a significant up diffusion of the Antimony buried layer. The total effective epitaxial thickness of the high voltage NPN device in the single layer process was 12 microns.

However, with a double epitaxial layer and the first test case of equal width layers, a sinker drive time of 500 minutes at a temperature of 1150° C. was required to link the top surface to the high voltage NPN buried layer (i.e., to link the sinker down and sinker up diffusions) at a doping level greater than $10^{16}$ ions/cm$^3$. The total effective epitaxial thickness of the high voltage NPN device was approximately 14.5 microns in the two layer process and the up diffusion of the Antimony buried layer is minimized.

With a double epitaxial layer and the second test case of unequal width layers, a sinker drive time of 500 minutes at a temperature of 1150° C. was sufficient to link the top surface to the high voltage NPN buried layer (i.e., to link the sinker down and sinker up diffusions) at a doping level greater than $4\times10^{16}$ ions/cm$^3$. The total effective epitaxial thickness of the high voltage NPN device was again approximately 14.5 microns in the two layer process and the up diffusion of the Antimony buried layer was the same as in the first test case.

In addition to reducing the collector contact resistance for the devices, the formation of the sinker up/down regions by implanting dopants at the interface of the two epitaxial layers provides the benefit of eliminating the need for sinker up mask and implant steps, and may eliminate the need for sinker down mask and implant steps.

As mentioned, the two epitaxial layers can have the same or different doping profiles, with the doping selected to obtain the desired characteristics of the high voltage NPN device. The relative thicknesses of the two epitaxial layers can be varied to obtain the desired characteristics of the low voltage devices (since the low voltage devices are formed in the upper epitaxial layer with the buried region at the interface between the two layers), with the total thickness of the two layers being selected to produce the desired characteristics of the high voltage devices. The low voltage devices can be fabricated by introducing the sinker up/down dopants under the low voltage device emitter region. This has the effect of reducing the effective epitaxial thickness, thereby reducing the collector resistance and collector transit time.

The method of the present invention is compatible with trench isolation techniques since the total epitaxial thickness (and hence trench depth) is minimized. The present invention also provides a solution to the problem of forming sinker up regions and low voltage vertical PNP devices on the same substrate using a common process flow. This problem arose because the dopants used to form the sinker up regions tended to diffuse up faster than the buried layer dopants, producing devices having undesirable characteristics.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method of fabricating high voltage complementary vertical NPN and PNP bipolar transistors structures in a silicon-on-insulator (SOI) structure, the SOI structure including a silicon substrate, a buried silicon oxide layer formed on the substrate and a conductive silicon layer formed on the buried silicon oxide layer, the method comprising:

forming a N-type buried region for the NPN bipolar transistor in the conductive silicon layer;

forming a P-type buried region for the PNP bipolar transistor in the conductive silicon layer, the P-type buried region being spaced-apart from the N-type buried region;

forming a first epitaxial silicon layer on the conductive silicon layer;

form a first layer of screen silicon oxide on the first epitaxial silicon layer;

masking the first screen silicon oxide layer to define spaced-apart first N-type and first P-type sinker regions in the first epitaxial silicon layer;

implanting N-type dopant into the first N-type sinker region, the first N-type sinker region being located above, but spaced-apart from, the N-type buried region;

implanting P-type dopant into the first P-type sinker region, the first P-type sinker region being located above, but spaced-apart from, the P-type buried region;

forming a second epitaxial silicon layer;

forming a second layer of screen silicon oxide on the second epitaxial silicon layer;

masking the second screen silicon oxide layer to define spaced-apart second N-type and second P-type sinker regions in the second epitaxial silicon layer;

implanting N-type dopant into the second N-type sinker region, the second N-type sinker region being located above, but spaced-apart from, the first N-type sinker region;

implanting P-type dopant into the second P-type sinker region, the second P-type sinker region being located above, but spaced-apart from, the second P-type sinker region;

performing an anneal step such that N-type dopant diffuses such that the second N-type sinker region overlaps with the first N-type sinker region and the first N-type sinker region overlaps with the N-type buried region, and such that P-type dopant diffuses such that the second P-type sinker region overlaps with the first P-type sinker region and the first P-type sinker region overlaps with the P-type buried region;

implanting P-type dopant into the second epitaxial silicon layer to define a P-type well above the P-type buried region;

forming an insulating trench between the N-type buried region and the P-type buried region, the insulating trench extending from an upper surface at the second epitaxial silicon layer to the buried silicon oxide layer.

\* \* \* \* \*

UNITED STATES PATENT AND TRADEMARK OFFICE
CERTIFICATE OF CORRECTION

PATENT NO.    : 6,365,447 B1  Page 1 of 1
DATED         : April 2, 2002
INVENTOR(S)   : Francois Hèbert et al.

It is certified that error appears in the above-identified patent and that said Letters Patent is hereby corrected as shown below:

<u>Title page,</u>
Item [54], in the title, change "EXPITAXIAL" to -- EPITAXIAL --

Signed and Sealed this

Eleventh Day of June, 2002

Attest:

Attesting Officer

JAMES E. ROGAN
*Director of the United States Patent and Trademark Office*